United States Patent [19]

Cardon et al.

[11] 4,002,989
[45] Jan. 11, 1977

[54] PROGRAMMABLE LOW PASS DIGITAL FILTER OF ANALOG SIGNAL

[75] Inventors: Carlos D. Cardon; Lawrence P. Griffone, both of Salt Lake City, Utah

[73] Assignee: Sperry Rand Corporation, New York, N.Y.

[22] Filed: July 29, 1975

[21] Appl. No.: 600,019

[52] U.S. Cl. .................................. 328/138; 328/48; 328/140; 328/167
[51] Int. Cl.² ........................ H03K 9/06; H03D 3/04
[58] Field of Search ............ 328/48, 138, 140, 167; 307/233

[56] References Cited
UNITED STATES PATENTS

| | | | |
|---|---|---|---|
| 3,537,001 | 10/1970 | Friend | 328/138 X |
| 3,636,270 | 1/1972 | McIntosh et al. | 328/138 X |
| 3,737,789 | 6/1973 | McCoy et al. | 328/138 |
| 3,757,233 | 9/1973 | Dixon | 328/138 |
| 3,761,809 | 9/1973 | Lockitt et al. | 328/140 X |
| 3,845,399 | 10/1974 | Cardon et al. | 328/138 |

*Primary Examiner*—John S. Heyman
*Attorney, Agent, or Firm*—Kenneth T. Grace; Thomas J. Nikolai; Marshall M. Truex

[57] ABSTRACT

A novel circuit combination comprised of small scale integrated (SSI) and medium scale integrated (MSI) integrated circuits (IC) for the filtering and passing of a selected low band of passable frequencies and of a selected amplitude is disclosed. The novel circuit combination is a special-purpose low pass digital filter of a programmable high frequency limit that is determined by the sample time $T_S$ duration and the programmable high $F_H$ frequency of the passable analog signal frequency having a nominal carrier signal frequency $F_A$. The analog signal is initially tested for a minimal amplitude and converted to a binary digital signal. The pulses of the binary digital signal are counted over the sample time $T_S$. If the number of pulses $N_A$ counted, i.e., the analog signal frequency $F_A$ where $F_A = (N_A/T_S)$, similarly, any frequency $F_X = (N_X/T_S)$, over the sample time $T_S$ is within the passable low band, i.e., passable ($F_A < F_H$), a first binary signal is generated. Alternatively, if the number of pulses $N_A$ counted over the sample time $T_S$ is without the passable low band, i.e., not passable ($F_A \geq F_H$), the first binary signal is not generated. The first binary signal is ANDed with the binary digital signal for gating out the binary digital signal to user equipment, while, alternatively, the absence of the first binary signal inhibits the gating of the binary digital signal to user equipment. Sample times continue throughout the detection-comparing operation to ensure a continuous filtering process.

6 Claims, 9 Drawing Figures

PROGRAMMABLE LOW PASS DIGITAL FILTER OF ANALOG SIGNAL

BACKGROUND OF THE INVENTION

The present invention is considered to be an improvement invention of our U.S. Pat. No. 3,845,399, titled Digital Detector of an Analog Signal.

SUMMARY OF THE INVENTION

In the digital filter of the present invention, an analog input signal of a frequency $F_A$ is initially tested for minimum amplitude and is then converted to a binary digital waveform which is edge-detected to provide an edge pulse for every cycle of the analog input signal. A continuously running sample time generator generates a timing base signal or a single sample time pulse every $T_S$ seconds, and the edge pulses are counted and compared to the high frequency limit $F_H$ over the sample time $T_S$ by a binary counter and comparator. If the edge pulse count $N_A$ remains within the passable low band during the sample time $T_S$ the binary counter and comparator permits a flip-flop to remain in its original True state. This flip-flop is sampled at the end of this sample time $T_S$ and the True output is transferred to a storage element which is then switched to the True state. The condition of the storage element remains in this True state throughout the first next following sample time $T_S$ to enable an AND gate that gates out the binary digital waveform to user equipment. Concurrently, during this first next following sample time $T_S$ the counting-comparing procedure is repeated with the binary counter counting the number of edge pulses $N_A$ from the edge detector. If the number of edge pulses $N_A$ counted remains within the passable low band, i.e., $F_A < F_H$, the binary counter and comparator continue coupling a True condition to the storage element with the binary counter reset, as before, by each sample time pulse at the beginning of each sample time $T_S$. However, if at the end of this first next following sample time $T_S$ the counter and comparator have counted a number of pulses without the passable low band, i.e., $F_A \geq F_H$, the binary counter and comparator set the flip-flop to a False state indicating that the analog input signal is of a frequency without the passable low band. At the end of this first next following sample time $T_S$, the False output of the flip-flop is transferred to the storage element which is then switched to its False state. The condition of the storage element remains in its False state throughout the second next following sample time $T_S$ to disable the AND gate from gating out the binary digital waveform to user equipment. The detecting-comparing operation continues over successive sample times $T_S$ with the binary digital waveform gated out or not gated out to user equipment as a function of the determination that the analog input signal of frequency $F_A$ of the immediately next previous sample time $T_S$ was within or was without the passable low band, respectively. The limit of the passable low band, i.e., the high $N_H$ number of pulses that defines the minimum number of pulses that exceeds the upper limit of the passable low band $N_A < N_H$, is programmably set into a register, which limit is, in turn, coupled to the comparator as binary coded bits. This permits the programmable change of the upper limit of the passable low band in contrast to the fixed limits of the bandpass of U.S. Pat. No. 3,845,399.

DESCRIPTION OF THE PREFERRED EMBODIMENT

Figure 1:
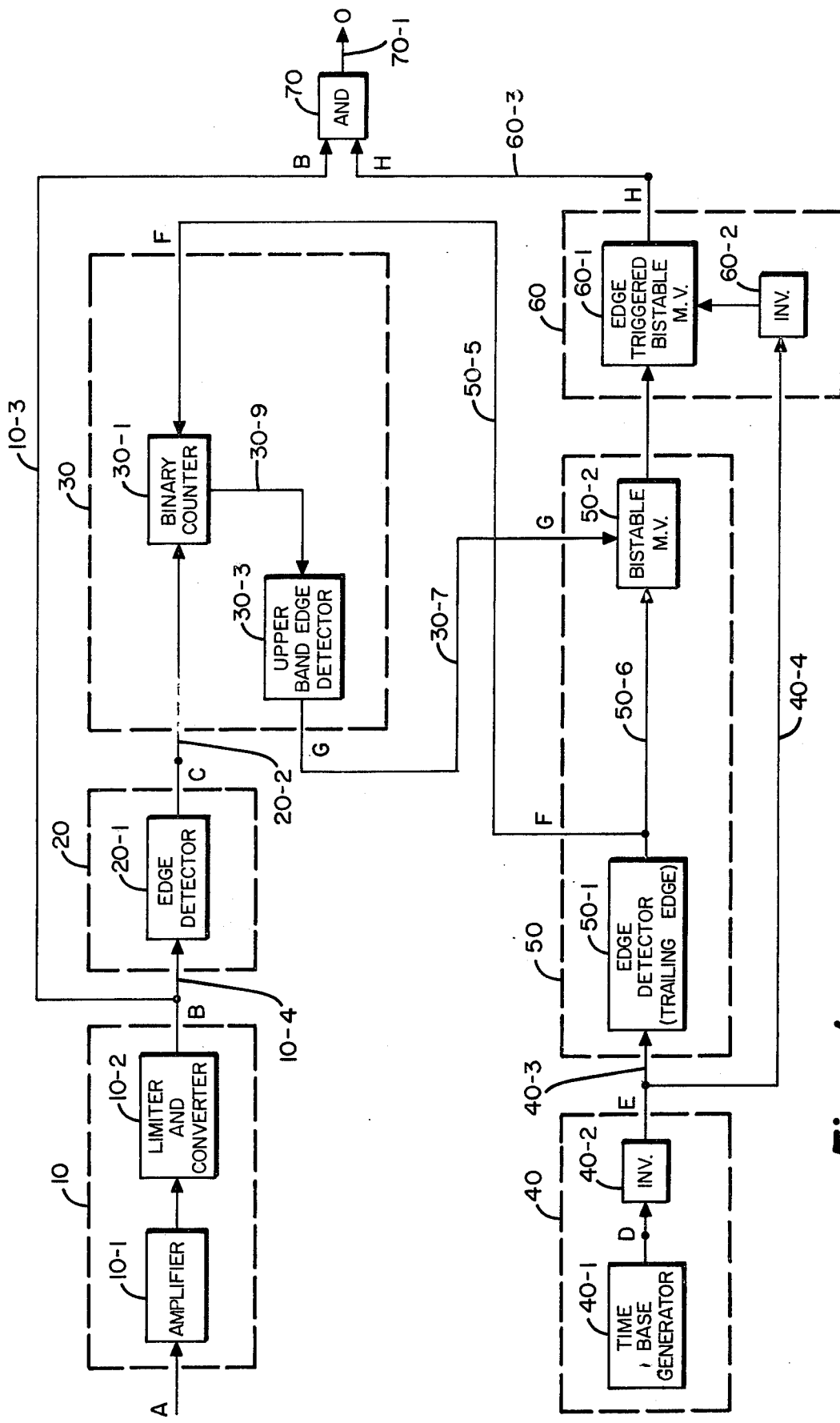
FIG. 1 is a block diagram of the special-purpose low pass digital filter of the present invention.
Figure 2:
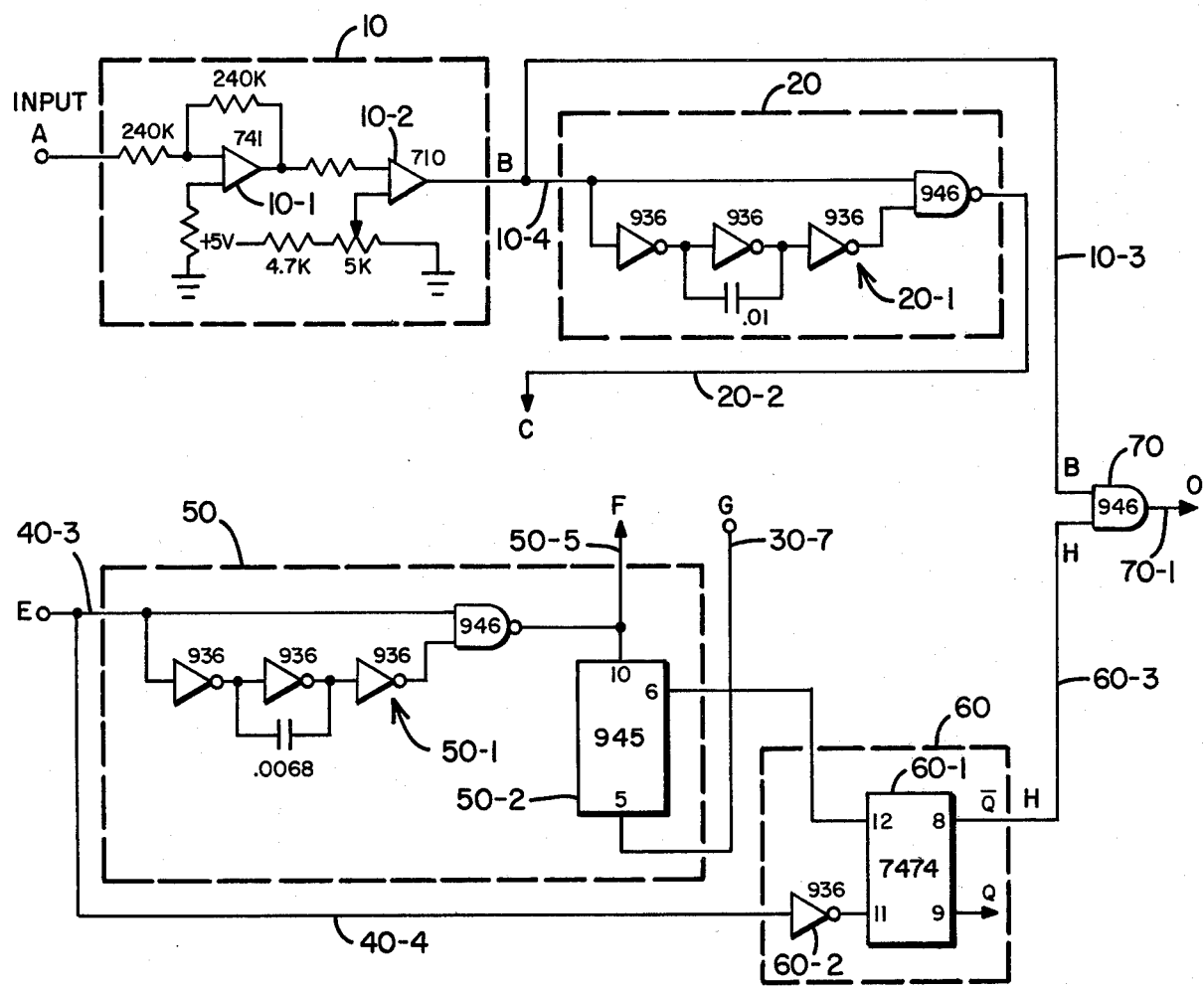
FIG. 2 is a logic level drawing of the converter edge detector, time base generator, counter-comparator register and memory element of the digital filter of FIG. 1.
Figure 3A:
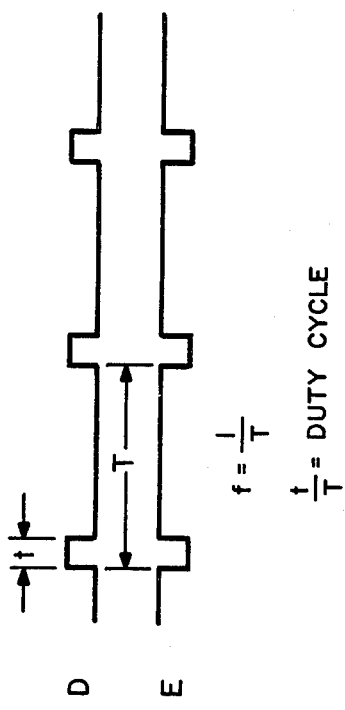
FIGS. 3a and 3b are a logic level drawing and the timing diagram therefor of the time base generator of the digital filter of FIG. 1.
Figure 3B:
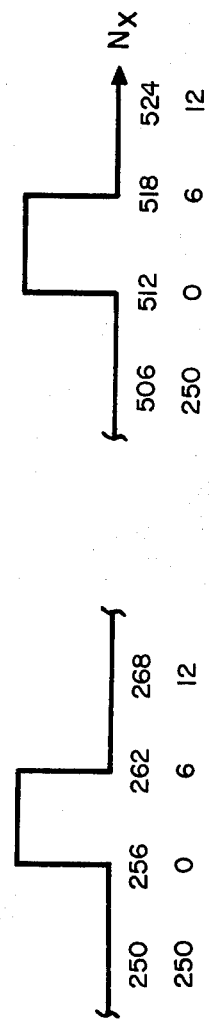
Figure 4:
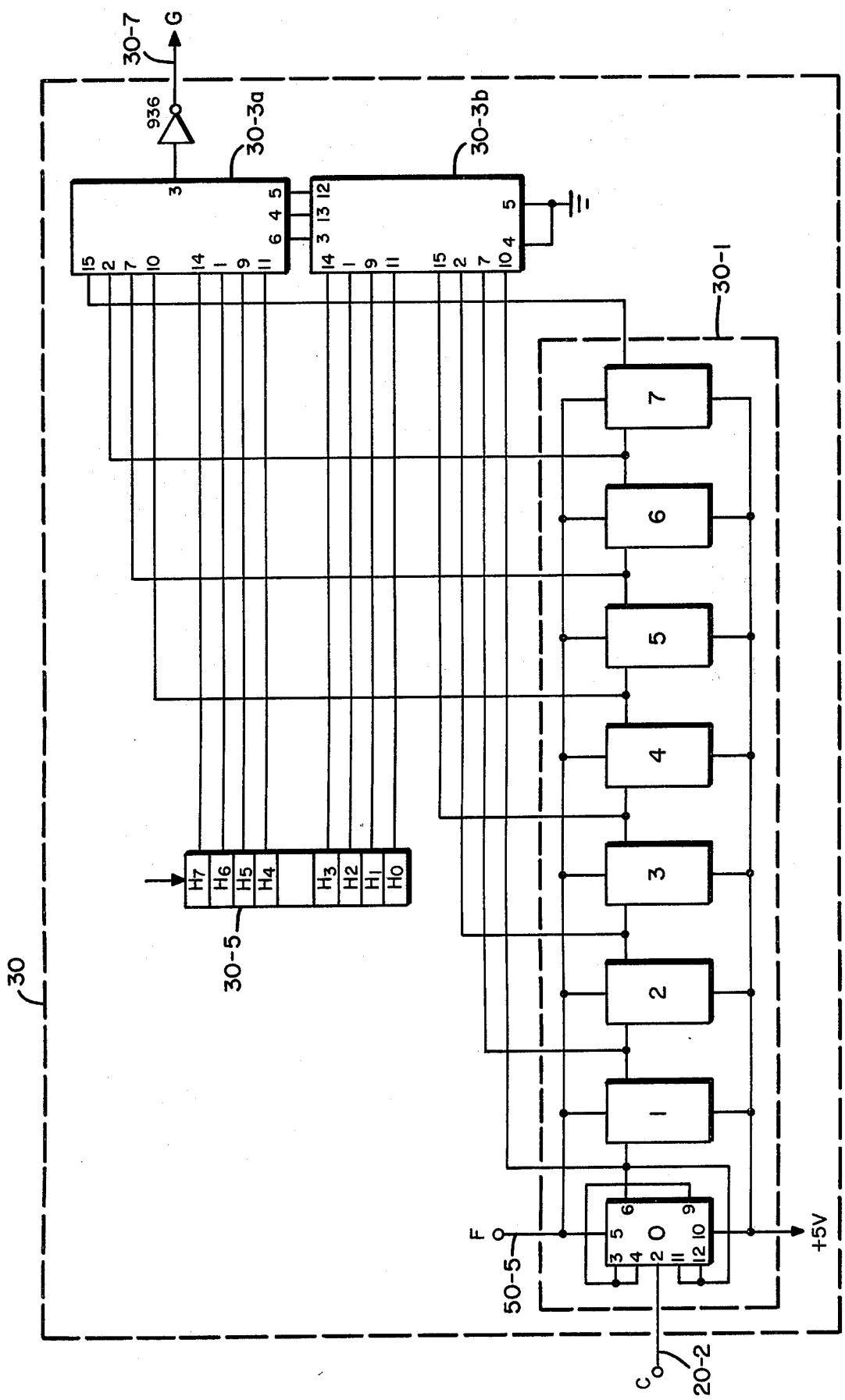
FIG. 4 is a logic level drawing of the counter-comparator of the digital filter of FIG. 1.
Figure 5A:
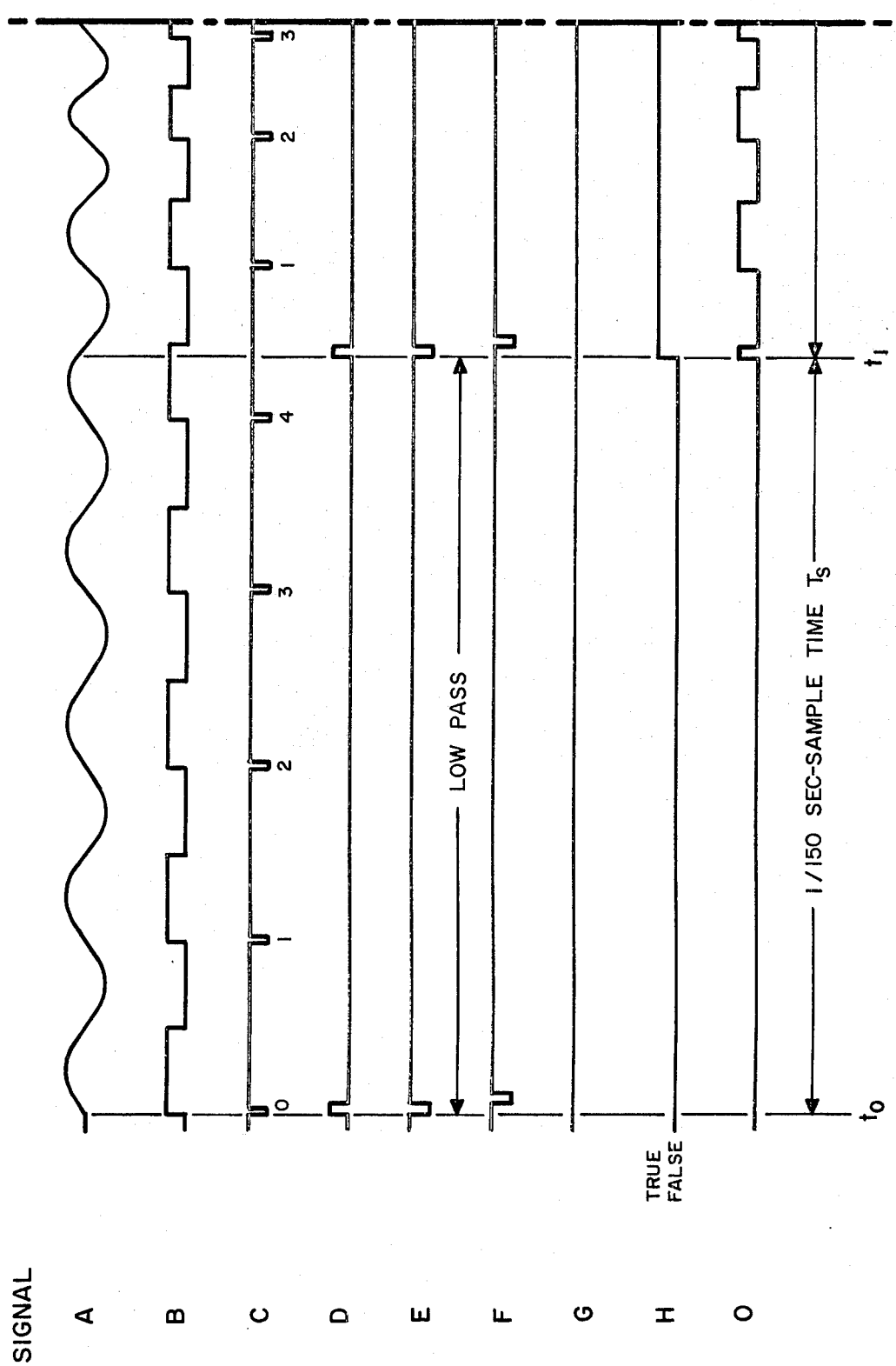
Figure 5B:
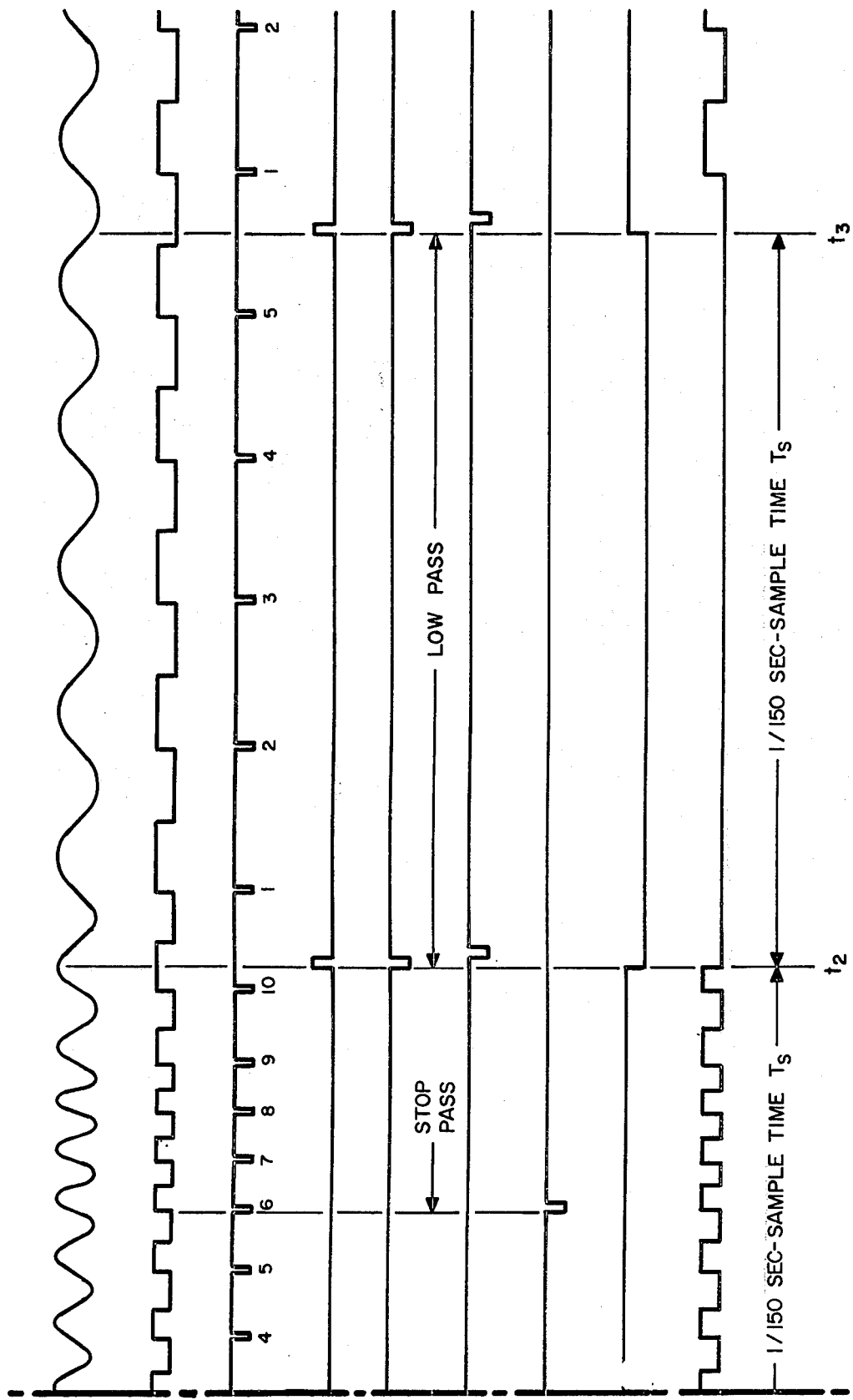

With particular reference to FIG. 1 there is presented a block diagram of the special-purpose low pass digital filter of the present invention, the elements thereof being illustrated in detail at their logic level in FIGS. 2, 3a, and 4. The special-purpose low pass digital filter of the present invention basically establishes a fixed sample time $T_S$ during which the actual number $N_A$ of cycles or pulses of a binary digital signal that is derived from a sampled analog signal are counted. The number $N_A$ is continuously being compared over the sample time $T_S$ to the number of $N_H$ of cycles or pulses of the binary digital signal that defines the minimum number of pulses that exceeds the passable low band $N_A < N_H$ of the digital filter. During the sample time prior to the time that it is first determined that the counted number of pulses is equal to the number $N_H$, i.e., $N_A = N_H$, a flip-flop in a counter-comparator remains in its initial True state. The counter continues counting and if prior to the end of the sample time the counted number of pulses equals or exceeds the number of pulses $N_H$, i.e., $N_A \geq N_H$, a first binary signal is generated that sets the flip-flop into its False state. At the end of the sample time the True or False state of the flip-flop is gated into a memory element, the associated True or False output of which enables or disables an AND gate to couple or to not couple the binary digital signal to user equipment.

Figure 5:
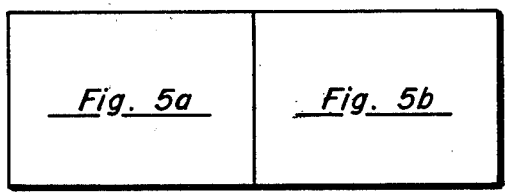
FIG. 5, comprised of FIGS. 5a and 5b, is a timing diagram illustrating the operation of the digital filter of FIG. 1.

Referring to the block diagram of FIG. 1 and the signal waveforms of FIG. 5, the analog signal A of a frequency $F_A$ is coupled to converter 10. Signal A is initially coupled to amplifier 10-1 which is an isolation and threshold detector which compares signal A to a threshold level and if signal A is above the threshold level couples signal A to converter 10-2. Converter 10-2 converts the analog signal A of the frequency $F_A$ to the binary digital signal B which is, in turn, via line 10-3, coupled as a first input to AND gate 70. The binary digital signal B is also coupled, via line 10-4, to edge detector 20 which produces, as an output therefrom, signal C which consists of a single short duration output pulse for every complete input cycle, e.g., for each positive transition, of signal B and, correspondingly, signal A. Signal C is, in turn, via line 20-2, coupled to counter-comparator 30. At binary counter 30-1, the pulses of signal C, beginning at time $t_0$ which is the beginning of the given sample time $T_S$ over which the signal A is to be sampled, are counted with the running total count therefrom being coupled to upper band edge detector 30-3, via line 30-9.

The binary counter 30-1, beginning at time $t_0$ which is the start of the given sample time over which the analog signal A is to be sampled, counts and accumulates the actual number $N_A$ of pulses of the binary digital signal B. Until upper band edge detector 30-3 determines within the given sample time $T_S$ that the actual number $N_A$ of pulses that have been counted by binary counter 30-1 is equal to or exceeds the minimum number of pulses that exceeds the passable low band, i.e., $N_A \geq N_H$, upper band edge detector 30-2 does not generate a signal G that is coupled to flip-flop 50-2 of counter-comparator 50. Signal G, if generated, sets flip-flop 50-2 to its False state from its initial True state. The binary counter 30-1 continues counting the actual number $N_A$ of pulses during the given sample time from time $t_0$ through $t_1$ and if prior to the end of the given sample time, as at $t_1$, the actual number $N_A$ of pulses has reached the minimum number of pulses that exceeds the passable low band, i.e., $N_A \geq N_H$, the upper band edge detector 30-3 generates a signal G which is coupled, via line 30-7, to flip-flop 50-2 to set flip-flop 50-2 into its False state from its initial True state.

Concurrently at time $t_0$, time base generator 40-1 of sample time generator 40, which time base generator 40-1 is a continuously running oscillator of a frequency $F = (1/T_S)$, generates a sample time pulse signal D and through inverter 40-2 the sample timing pulse signal E which is coupled, in parallel, via line 40-3, to trailing edge detector 50-1 of counter-comparator register 50 and, via line 40-4, to inverter 60-2 of memory element 60. Trailing edge detector 50-1 generates signal F, which is a relatively short duration pulse at each positive transition or trailing edge of signal E, and which signal F is, in turn, coupled, in parallel, to binary counter 30-1 of counter-comparator, via line 50-5, and to flip-flop 50-2 of counter-comparator register 50, via line 50-6. Signal E at the end of each sample time $T_S$, as at time $t_1$, via line 40-4 and inverter 60-2, gates the True or False state of flip-flop 50-2 into edge triggered flip-flop 60-1 of memory element 60 after which time signal F resets binary counter 30-1 and flip-flop 50-2 back to their initial O and True states, respectively.

The output of memory element 60 is, in turn, via line 60-3, coupled as a second input to AND 70. Thus, whenever flip-flop 50-2 is in its True state at the beginning of a sample time $T_S$, its True output at AND 70 enables the binary digital signal B to be gated therethrough as signal O and thence to be coupled to user equipment. Conversely, whenever flip-flop 50-2 is in its False state at the beginning of a sample time $T_S$, its False output at AND 70 disables the binary digital signal B from being gated therethrough.

Referring in particular to the logic level drawings of FIGS. 2, 3a and 4, the elements thereof are commercially available SSI or MSI IC elements, the operating characteristics of which are well understood by those of ordinary skill in the art. With more particular reference to FIG. 4, counter-comparator 30 is comprised of counter 30-1 which is constructed of eight flip-flops, e.g., Motorola MC 945, intercoupled in a manner as more detailed with particular respect to stage O thereof. Signal C, via line 20-2, triggers counter 30-1, one count per pulse of signal B, the counts of which are coupled from the outputs of the respective stages 0 through 7 of counter 30-1 to the respective input lines of upper band edge detector 30-3 (formed of, e.g., two TI Comparators SN 7485, 30-3a and 30-3b).

Also provided is an associated register, or, e.g., sets of switches, 30-5 for coupling the respective binary coded bits $H_0$ through $H_7$, represented by the respectively associated voltage levels of logic 1 or 0, of register 30-5 to the respective inputs of upper band edge detector 30-3. Thus, the changing or actual count $N_A$ as counted by and accumulated in counter 30-1 is coupled to upper band edge detector 30-3 while, concurrently, the minimum number of pulses that exceeds the passable low band $N_A \geq N_H$ as represented by bits $H_0$ through $H_7$, are being compared thereto by register 30-5. Thus, as explained hereinabove, with counter 30-1 starting to count and accumulating the actual count $N_A$ from an initial cleared state or 0 count at the beginning of a sample time $T_S$, as at time $t_0$, upper band edge detector 30-3 compares the actual count $N_A$ to the count $N_H$. As counter 30-1 continues its counting and accumulating of the actual count $N_A$, if prior to the start of the next following sample time $T_S$, as at time $t_1$, upper band edge detector 30-3 compares the actual count $N_A$ to the count $N_H$ and when, and if, $N_A \geq N_H$ it generates and couples a signal G to its single associated output line 30-7. Signal F, via line 50-5, is utilized to reset or clear counter 30-1 at the start of each sample time $T_S$ for the next count-compare operation during the next following sample time $T_S$.

With particular reference to FIG. 5 there is presented a timing diagram for a typical set of waveforms that may be associated with the digital filter of FIG. 1. In this exemplary illustration of typical waveforms, it is assumed that the minimum number of pulses that exceeds the passable low band is the count $N_H = 6$ and, accordingly, the configuration of the bits coupled to and stored in register 30-5 of FIG. 4 is as follows:

| $H_7$ | $H_6$ | $H_5$ | $H_4$ | $H_3$ | $H_2$ | $H_1$ | $H_0$ |
|---|---|---|---|---|---|---|---|
| 0 | 0 | 0 | 0 | 0 | 1 | 1 | 0. |

Using this assumed minimum number of pulses that exceeds the upper limit of the passable low band of $N_H = 6$, it can be seen that during the sample time $T_S$ of from time $t_0$ through $t_1$, upper band edge detector 30-3 does not detect the actual count $N_A = N_H = 6$, i.e., $N_A < N_H$ prior to the end of the sample time $T_S$ as at time $t_1$. Accordingly, at the beginning of the first next following sample time $T_S$, as at time $t_1$, AND 70 is enabled by the True output, signal H of memory element 60 whereby the binary digital signal B of signal 0 is emitted therefrom during this first next following sample time $T_S$ as from time $t_1$ through time $t_2$.

During the first next following sample time $T_S$ as from time $t_1$ through time $t_2$, upper band edge detector 30-3 detects an actual count $N_A = N_H = 6$, i.e., $N_A < N_H$ such that the so-generated signal G sets flip-flop 50-2 into its False state. Now, at the end of the first next following sample period $T_S$ as at time $t_2$ the False state of flip-flop 50-2 is gated into edge triggered flip-flop 60-1 by signal E, via line 40-4 and inverter 60-2, such that memory element 60 couples its False state of signal H as a second input to AND 70 disabling the gating of the binary digital signal B to its output line as signal O.

During the second next following sample time $T_S$ as from time $t_2$ through $t_3$, upper band edge detector 30-3 does not detect the actual count $N_A = N_H = 6$, i.e., $N_A < N_H$, such that flip-flop 50-2 remains in its initial True state. Thus, at the end of the second next following sample time $T_S$, as at time $t_3$, flip-flop 50-2 is in its True state such that the signal E, via line 40-4 and inverter 60-2, gates the True state of flip-flop 50-2 into edge triggered flip-flop 60-1 such that the True output of memory element 60 of signal H is coupled as a second input to AND 70 to enable the digital signal B to be gated therethrough as the signal 0.

Figure 6:
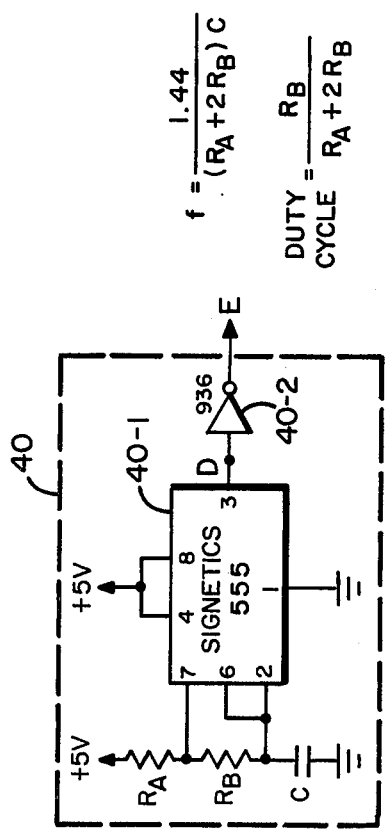
FIG. 6 is a plot of the output of the digital filter of FIG. 1 when using the counter of FIG. 4.
Figure 6:
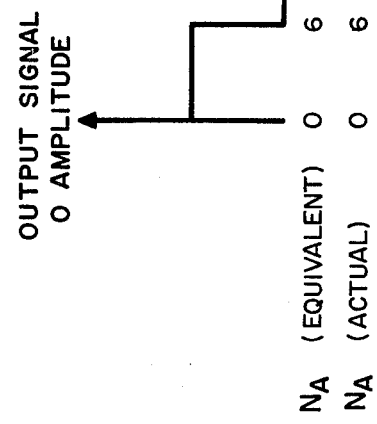

With particular reference to FIG. 6 there is presented an illustration of the characteristics of the low pass digital filter of FIG. 1 using the eight stage counter 30-1 of FIG. 4. Using an eight stage counter, and without an intervening resetting or clearing signal F it is to be appreciated that the counter 30-1 would continuously cycle through its count 0 through 255 to start over at an equivalent count of 256 through 511 and then to start over and count through 512 through 767, the counting sequence to continue until terminated by a resetting or clearing signal F. However, even though the low pass digital filter of FIG. 1, as implemented by the detail logic of FIGS. 2, 3a and 4, has the cyclical or periodic characteristics of FIG. 6 (the periodic characteristic repeats at a frequency $F_S = (2^N/T_S)$, where $N$ is the number of stages in counter 30-1 of FIG. 4), it is to be appreciated that the expected analog signal A that is to be sampled by the low pass digital filter of FIG. 1 will not have an expected $N_H$ or $F_H$ above the capability of counter 30-1, i.e., $N_H \leq 255$. Of course, it is to be appreciated that the upper limit $N_H$ of the particular counter-comparator 30 may be increased by the addition of additional comparators, e.g., 30-3c and the necessary, e.g., four stages 8, 9, 10, 11 to counter 30-1 with the necessary addition of the additional, e.g., four stages to register 30-5. It is further to be appreciated that the output of this filter is a constant level digital signal set by logic gate 70 of FIG. 1, assuming that the input signal meets the amplitude and passband requirements of the circuit. This signal may subsequently be amplified or filtered to obtain an arbitrary level sinusoidal signal, if required.

What is claimed is:

1. A programmable low pass digital filter of an analog signal, comprising:
    means receiving an input analog signal of a frequency $F_A$ for generating a binary digital signal of a frequency $F_A$ therefrom;
    counting means coupled to said receiving means for counting the number of cycles $N_A$ of said binary digital signal during a preset sample time $T_S$;
    comparator means coupled to said counting means for determining when said number of pulses $N_A$ is equal to a preset high $N_H$ number of pulses;
    programming means coupled to said comparator means for setting in said comparator means said preset high $N_H$ number of pulses that defines the minimum number of pulses that exceeds the upper limit of a preset passable low band;
    first memory means responsively coupled to said comparator means for generating as the alternative output signals, an output True signal or an output False signal indicating that said counting means has counted a number of pulses $N_A$ of said binary digital signal that is within or without, respectively, said preset passable low band;
    first gating means;
    means coupling said binary digital signal as a first input to said first gating means;
    means coupling said first memory means to said first gating means for alternatively coupling said True output signal or said False output signal as a second input to said first gating means, said True output signal or said False output signal enabling or disabling said first gating means to provide or not to provide, respectively, as an output signal therefrom said binary digital signal.

2. The digital filter of claim 1 further including:
    second memory means responsively coupled to said comparator means for alternatively coupling to said first memory means a True or a False state indicating that said comparator means has determined that said number of pulses $N_A$ is within or without said preset passable low band, respectively.

3. The digital filter of claim 2 further including:
    time base generator means for generating a continuous time base signal comprising a series of timing pulses, one pulse every sample time $T_S$; and,
    second gating means responsively coupled to said time base generator means and coupled to said first memory means for gating said True or said False state of said second memory means into said first memory means during a given one of said sample times $T_S$.

4. The digital filter of claim 2 further including:
    edge detector means coupled to said receiving means for generating an edge pulse for every cycle of said binary digital signal and coupling one of said edge pulses to said binary counter for every one of the pulses of said binary digital signal.

5. A programmable low pass digital filter of an analog signal, comprising:
    means for receiving an input analog signal of a frequency $F_A$ for generating a binary digital signal of a frequency $F_A$ therefrom;
    counting means coupled to said receiving means for counting the number of pulses $N_A$ thereof during a preset sample time $T_S$;
    comparator means coupled to said counting means for determining when said number of pulses $N_A$ is equal to a preset high $N_H$ number of pulses and generating a first binary signal;
    programming means coupled to said comparator means for setting in said comparator means said preset high $N_H$ number of pulses and defining a preset passable low band $N_A < N_H$;
    first memory means for generating as the alternative output signals an output True signal or an output False signal indicating that said counting means has counted a number of pulses $N_A$ of said binary digital signal that is within or without, respectively, said preset passable low band;
    second memory means responsively coupled to said comparator means for alternatively coupling to said first memory means a True or a False state as determined by said first binary signal;
    first gating means;
    means coupling said binary digital signal as a first input to said first gating means;
    means coupling said first memory means to said first gating means for alternatively coupling said True output signal or said False output signal as a second input to said first gating means, said True output signal or said False output signal enabling or disabling said first gating means to provide or not provide, respectively, as an output signal therefrom said binary digital signal;

time base generator means for generating a continuous time base signal comprising a series of timing pulses, one pulse every sample time $T_S$;

second gating means responsively coupled to said time base generator means and coupled to said first memory means for gating the True or the False state of said second memory means into said first memory means during a given one of said sample times $T_S$ and coupling corresponding True or False output signals from said first memory means as a second input to said first gating means during the first next following one of said sample times $T_S$.

6. A programmable low pass digital filter receiving an input signal of a frequency $F_A$ including:

counting means for counting the number of pulses $N_A$ of said input signal during a given one of successive sample times $T_S$ and then generating during the next subsequent sample time $T_S$ a first signal if the counted number of pulses $N_A$ is less than a high number of pulses $N_H$ and then generating during said next subsequent sample time $T_S$ a second signal if the counted number of pulses $N_A$ is equal to or greater than said high number of pulses $N_H$ and thereby defining a passable low band, $N_A < N_H$;

gating means responsively coupled to said input signal and said first and second signals for passing the input signal received during said next subsequent sample time to user equipment only if the input signal was determined to be within said passable low band;

said counting means including programmable means for programmably varying the higher $N_H$ number of pulses of said passable low band for programmably varying the higher $F_H$ frequency limit of said passable low band.

* * * * *